United States Patent
Simonson et al.

(10) Patent No.: US 10,698,104 B1
(45) Date of Patent: Jun. 30, 2020

(54) APPARATUS, SYSTEM AND METHOD FOR HIGHLIGHTING ACTIVITY-INDUCED CHANGE IN MULTI-PASS SYNTHETIC APERTURE RADAR IMAGERY

(71) Applicant: National Technology & Engineering Solutions of Sandia, LLC, Albuquerque, NM (US)

(72) Inventors: Katherine M. Simonson, Cedar Crest, NM (US); David Nikolaus Perkins, Cleveland, OH (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 328 days.

(21) Appl. No.: 15/936,806

(22) Filed: Mar. 27, 2018

(51) Int. Cl.
*G01S 13/90* (2006.01)
*G06T 5/50* (2006.01)
*H01L 27/148* (2006.01)

(52) U.S. Cl.
CPC ........ *G01S 13/904* (2019.05); *G01S 13/9023* (2013.01); *G01S 13/9029* (2013.01); *G01S 13/9088* (2019.05); *G06T 5/50* (2013.01); *G06T 2207/10044* (2013.01); *H01L 27/14831* (2013.01)

(58) Field of Classification Search
CPC combination set(s) only.
See application file for complete search history.

(56) References Cited

U.S. PATENT DOCUMENTS

| 7,912,321 | B1 | 3/2011 | Simonson | |
| 8,103,116 | B1 | 1/2012 | Simonson et al. | |
| 8,692,704 | B1 * | 4/2014 | Perkins | G01S 13/90 |
| | | | | 342/191 |
| 8,786,485 | B2 | 7/2014 | Atkins et al. | |
| 9,239,384 | B1 * | 1/2016 | Chow | G06K 9/00637 |
| 10,042,048 | B1 * | 8/2018 | Moya | G01S 13/9023 |
| 10,345,440 | B1 * | 7/2019 | West | G01S 13/9027 |
| 2011/0299733 | A1 * | 12/2011 | Jahangir | G01S 13/9029 |
| | | | | 382/103 |

(Continued)

OTHER PUBLICATIONS

Michael et al, Statistically Normalized Coherent Change Detection for Synthetic Aperture Sonar Imagery (Year: 2016).*

(Continued)

*Primary Examiner* — Mamadou L Diallo
(74) *Attorney, Agent, or Firm* — Madelynne J. Farber; Mark A. Dodd

(57) ABSTRACT

Described herein are various technologies relating to constructing a differenced change product (DCP) image. A plurality of synthetic aperture radar (SAR) images of a scene are generated based upon radar signals directed towards and reflected off of the scene, and a plurality of coherence change detection (CCD) images of the scene are generated based upon the SAR images. The CCD images are registered with one another, and their pixel values re-scaled according to a monotonic mapping function. The DCP image is generated based upon a computed pixel-wise difference between a pair of the re-scaled CCD images. The DCP image identifies locations in the scene where human activity-induced change is likely to have occurred between a pair of SAR passes of the scene.

20 Claims, 9 Drawing Sheets

(56) References Cited

U.S. PATENT DOCUMENTS

2012/0319893 A1* 12/2012 Yun .................... G01S 13/9023
                                                    342/25 C
2018/0172824 A1*  6/2018 Beckett ................ G01S 13/904

OTHER PUBLICATIONS

G-Michael, "Statistically Normalized Coherent Change Detection for Synthetic Aperture Sonar Imagery", Proc. of SPIE, vol. 9823, Detection and Sensing of Mines, Explosive Objects, and Obscured Targets XXI, 98231T, May 3, 2016, pp. 1-13.

* cited by examiner

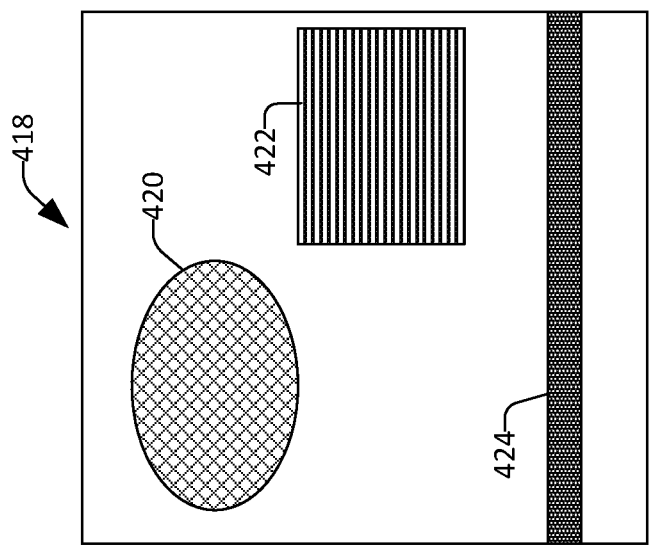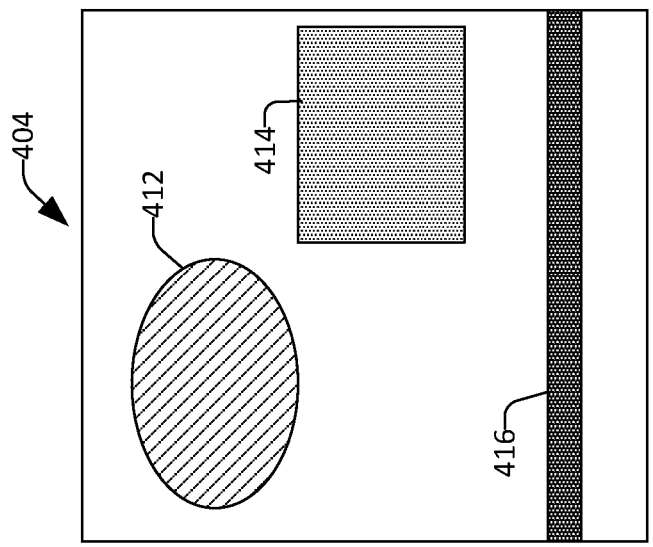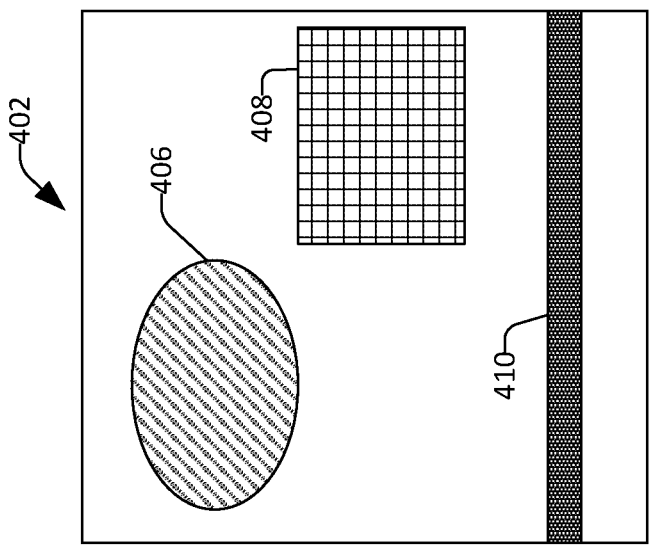
FIG. 4

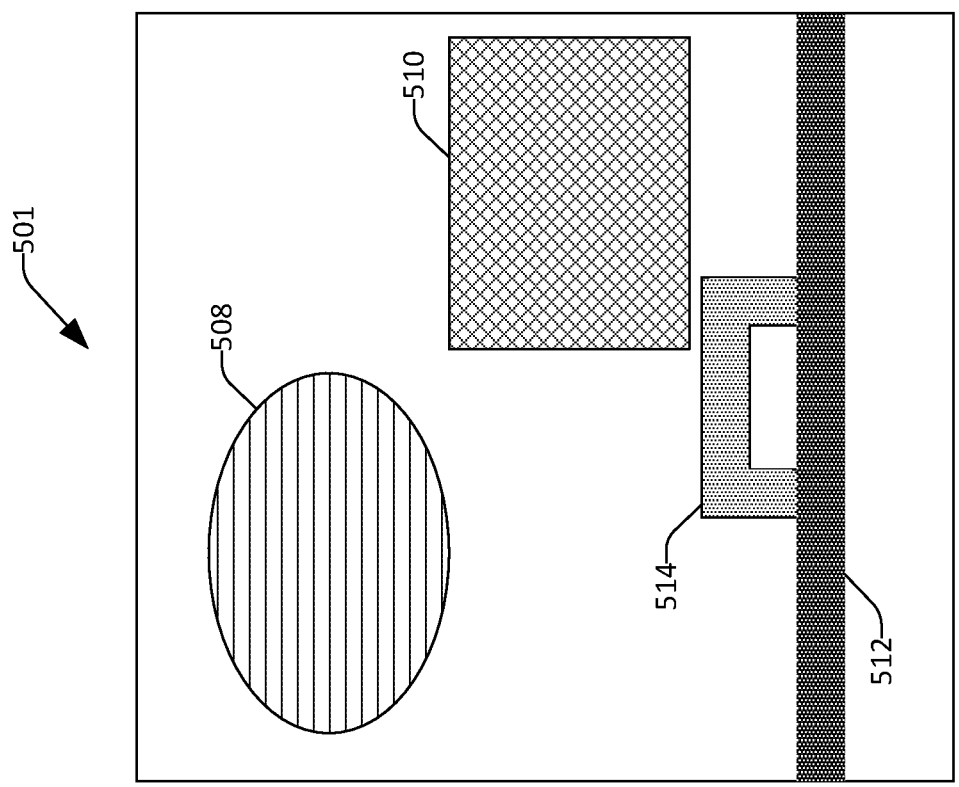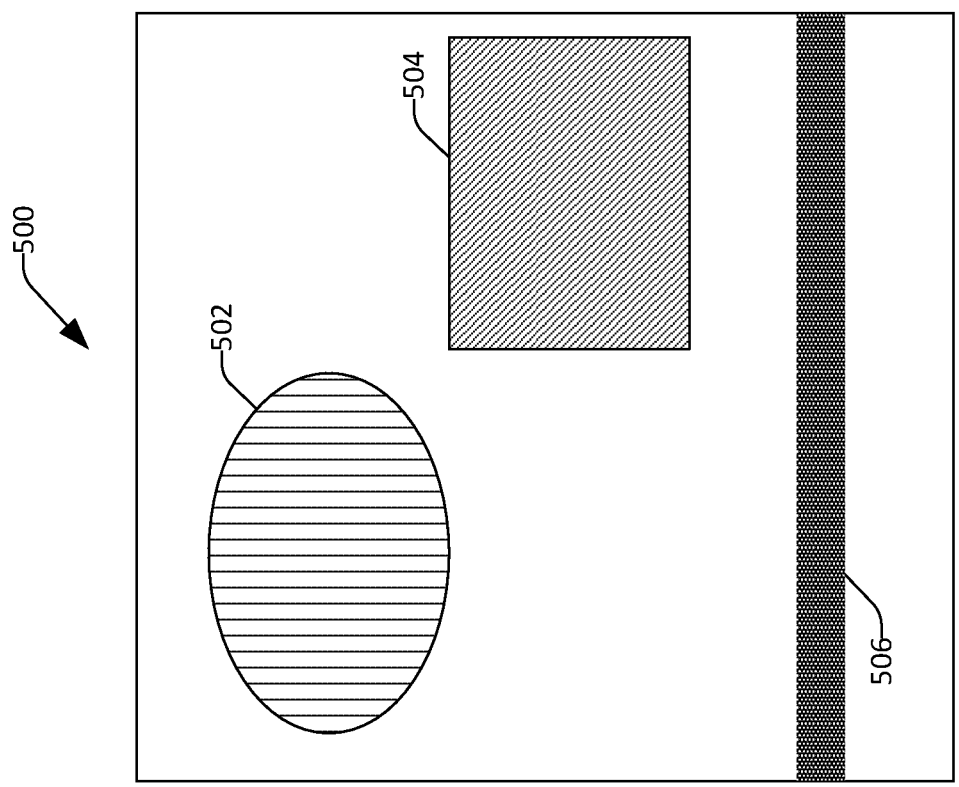
FIG. 5

APPARATUS, SYSTEM AND METHOD FOR HIGHLIGHTING ACTIVITY-INDUCED CHANGE IN MULTI-PASS SYNTHETIC APERTURE RADAR IMAGERY

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

Synthetic aperture radar (SAR) systems can be employed to generate SAR images of a scene. Summarily, a SAR system comprises a radar transmitter and a radar receiver placed in an aircraft that passes by a scene of interest. During a pass by the scene, the radar transmitter directs radar signals towards the scene, wherein the radar signals reflect from the scene, and the radar receiver detects the reflected radar signals. A computing system is in communication with the radar receiver, and the computing system constructs a SAR image of the scene based upon the reflected radar signals detected by the radar receiver during the pass by the scene. SAR images exhibit advantages over optical images in certain respects. For instance, radar signals emitted by the radar transmitter and received by the radar receiver can pass through cloud cover. Additionally, the SAR system can generate images of a scene at night. Still further, SAR images exhibit details that do not appear in optical images. For instance, a SAR image can depict gradations of texture (e.g., coarse to fine gravel), which are typically not able to be ascertained in optical images.

Coherent change detection (CCD) images can be generated based upon complex-valued SAR images. With more specificity, a CCD image can be generated based upon a pair of finely registered SAR images of a scene corresponding to two passes by the scene, wherein the CCD image depicts alterations in the scene that have occurred between the two passes. Stated differently, a CCD image can reveal subtle rearrangements of scatterers that are present in a single resolution cell of a complex SAR image. Each element (pixel value) in a CCD image is a realization of the sample coherence magnitude function computed over a centered local window of pixels. The sample coherence magnitude, often denoted $\hat{\gamma}$, varies between 0 and 1. Pixels with low values indicate locations in a scene where complex change has occurred between two SAR passes by the scene used to generate the CCD image, and values close to unity are found in pixels corresponding to unchanged scene elements.

CCD images have been identified as being useful for showing human activity-induced change phenomena, including vehicle tracks on a gravel road, soil displacements caused by a rotary hoe, and mowing of grass. Highlighting these changes for an analyst tasked with monitoring the scene over time can assist the analyst in determining how busy the scene has been between two SAR passes, and whether any objects of interest (vehicles, sheds, crates) have been repositioned between the two SAR passes. It can be ascertained, however, that not all areas of low coherence in a CCD image correspond to locations where human-induced change has occurred. For example, a CCD image may include pixels containing SAR shadows, standing water, or vegetation, which also typically experience a loss of phase coherence between SAR passes. When a CCD image includes several regions of low phase coherence, the analysts may be visually overwhelmed, particularly for highly cluttered scenes. Therefore, while CCD images may be helpful to an analyst who is tasked with monitoring the scene, the CCD images may not be ideal due to the CCD images potentially depicting a significant amount of clutter.

SUMMARY

The following is a brief summary of subject matter that is described in greater detail herein. This summary is not intended to be limiting as to the scope of the claims.

Described herein are various technologies pertaining to the generation of an image (referred to herein as a differenced change product (DCP) image), wherein the DCP image is designed to identify locations in a scene where human-induced change has occurred. An analyst, then, when reviewing this image, may be able to relatively quickly determine whether further investigation is necessary as to activity (or lack of activity) in the scene. The DCP can indicate, for example, that a vehicle has taken a path through the scene, while simultaneously the DCP image fails to include clutter associated with corresponding CCD images of the scene. The DCP image therefore allows the analyst to quickly understand areas of the scene that are of interest to the analyst.

The DCP image is based upon a plurality of CCD images, which in turn are based upon a plurality of SAR images. Generation of a DCP image is now described. An aircraft (e.g., airplane, unmanned aerial vehicle (UAV), or the like) includes a SAR system, which comprises a radar transmitter, a radar receiver, and a computing device that is electrically coupled to the radar transmitter and the radar receiver. The aircraft is directed to pass by a scene of interest (a scene being monitored by an analyst) multiple times, where the imaging geometry and radar settings are nearly identical for each pass by the scene, and further where the computing device generates a SAR image for each pass of the aircraft by the scene.

The computing device generates a plurality of CCD images based upon the SAR images of the scene. As indicated previously, a CCD image of the scene is generated based upon a pair of SAR images. Therefore, in an example, the computing device can generate several CCD images, one for each consecutive pair of SAR images in the plurality of SAR images. The computing device registers the plurality of CCD images with one another, thereby creating a CCD image stack. The registration process aligns the CCD images such that pixel (i, j), for each CCD image in the CCD image stack, is coarsely aligned with the same patch of ground in the scene.

The DCP image is generated based upon the CCD images. For example, the computing device calculates, on a pixel-wise basis, a difference between sample coherence values across two CCD images. In other words, to generate the DCP image, the computing device calculates a difference of the sample coherence magnitude estimator between two CCD images for each pixel location in the CCD images. The sample coherence magnitude estimator $\hat{\gamma}$ has a statistical distribution that exhibits the property of heteroskedasticity, such that the variance of the estimator $\hat{\gamma}$ increases as the underlying coherence decreases. This causes low coherence portions of a CCD image, which may be associated either with clutter or with human-induced activity, to exhibit a salt-and-pepper-like appearance.

Therefore, prior to calculating the pixel-wise difference of the sample coherence between the two CCD images, the computing device scales pixel values of the CCD images according to a mapping function. The mapping function is configured such that the difference between pixels of the scaled CCD images for already-low coherence values is diminished relative to a difference between pixels of the unscaled CCD images. In exemplary embodiments, the mapping function is a continuous monotonic mapping function having a sigmoid shape. Subsequent to scaling the pixel values of the CCD images, the computing device computes the difference between the sample coherence magnitude values of the CCD images on a pixel-wise basis. For regions where coherence is low in both CCD images (e.g., corresponding to a region of vegetation cover in the scene), the magnitude of the computed difference between the sample coherence magnitude of the CCD images is low. By contrast, for regions where coherence is low in one of the CCD images and high in the other, (e.g., potentially corresponding to human-induced activity) the magnitude of the computed difference between the sample coherence magnitude of the CCD images is high. The computing device then generates the DCP image based upon the computed differences. By way of example, pixels for which the computed difference has a magnitude in a first range of values can be displayed in a first color, whereas pixels for which the computed difference has a magnitude in a second range of values can be displayed in a second color.

Additional DCP images can be generated over time, as additional CCD images of the scene are generated. In a nonlimiting example, the DCP image can be generated based upon a most-recently generated pair of CCD images, where the most-recently generated CCD images are based on most-recently generated respective pairs of SAR images. Other techniques for choosing which CCD images to include in the CCD images used to generate the DCP image are also contemplated. For instance, only CCD images with sufficiently high quality generated based upon SAR images captured during certain windows in time, over the course of days, can be used The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

BRIEF DESCRIPTION OF THE DRAWINGS

FIG. 4 illustrates three exemplary SAR images of a scene.

FIG. 5 depicts two exemplary CCD images of the scene based upon the SAR images shown in FIG. 4.

DETAILED DESCRIPTION

Figure 1:
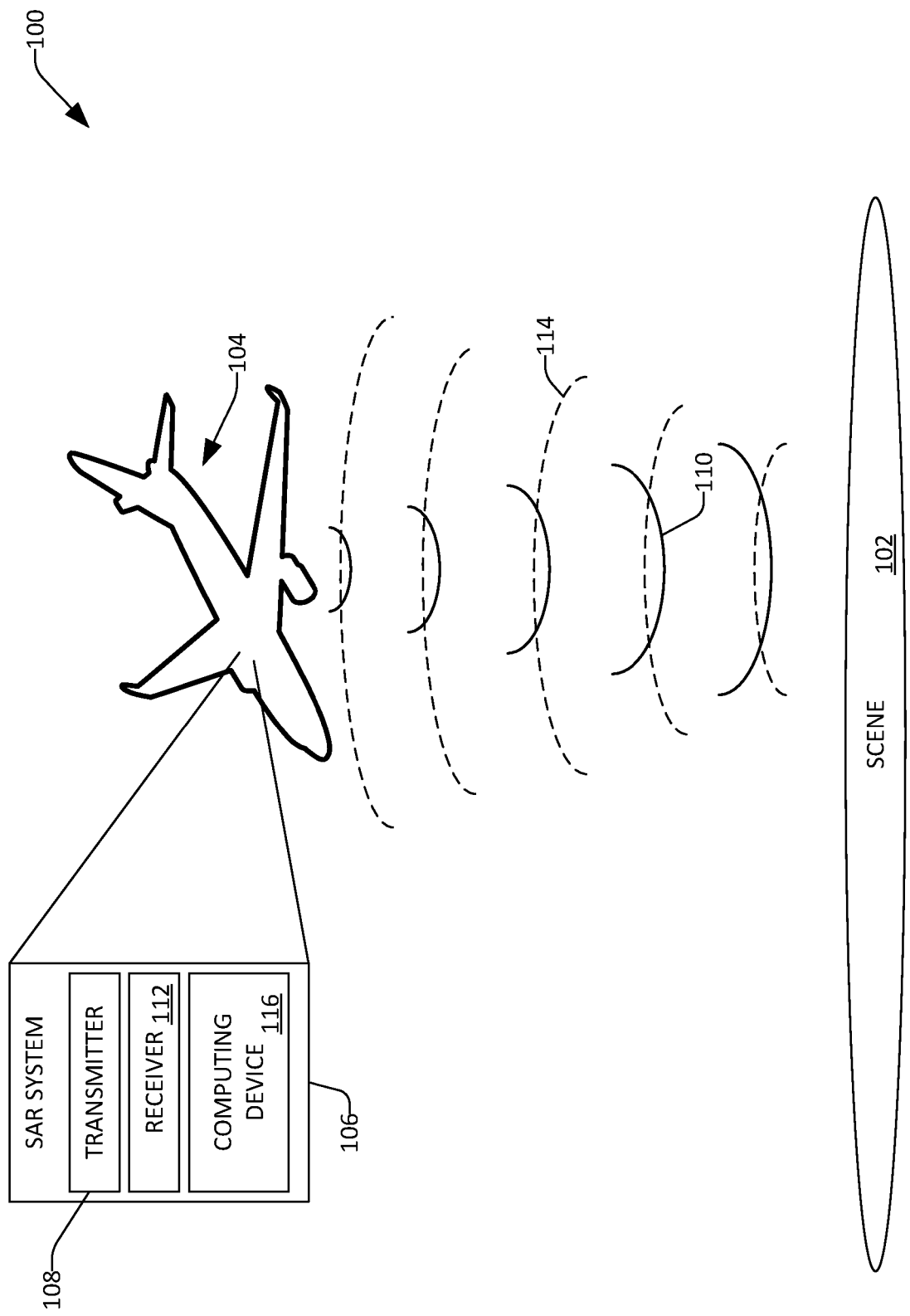
FIG. 1 is a schematic that illustrates a SAR system constructing SAR images of a scene.

Various technologies pertaining to generating DCP images and highlighting locations in a scene that may be of interest to an analysis based upon the DCP images are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Further, as used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Additionally, as used herein, the term "exemplary" is intended to mean serving as an illustration or example of something, and is not intended to indicate a preference.

With reference now to FIG. 1, an exemplary system 100 that is configured to construct a DCP image of a scene 102 is illustrated. The system 100 includes an aircraft 104 that comprises a SAR system 106. The aircraft 104 can be an airplane, an unmanned aeronautical vehicle (UAV), a helicopter, a satellite, etc. The SAR system 106 includes a radar transmitter 108 that is configured to emit radar signals 110 (shown in solid line) towards the scene 102. For instance, the radar transmitter 108 includes a transmit antenna that is energized to cause the radar signals 110 to be emitted from the transmitter 108 towards the scene 102. The SAR system 106 also includes a radar receiver 112 that is configured to detect radar signals 114 (shown in dashed line) that have reflected from the scene 102. The SAR system 106 also comprises a computing device 116 that is in communication with the radar transmitter 108 and the radar receiver 112. The computing device 116 is configured to transmit control signals to the radar transmitter 108, wherein the radar transmitter 108 transmits the radar signals 110 based upon the control signals. The computing device 116 is further configured to receive electrical signals from the radar receiver 112, wherein the electrical signals are representative of the radar signals 114 detected by the radar receiver 112. The computing device 116 is additionally configured to generate a DCP image of the scene 102, wherein the DCP image of the scene 102 depicts locations of human-activity-induced changes in the scene 102. This type of information is particularly useful for an analyst who is tasked with monitoring the scene 102. While the computing device 116 is illustrated as being co-located with the radar transmitter 108 and the radar receiver 112, it is to be understood that at least some functionality described as being performed by the computing device 116 may be performed at a ground station.

Figure 2:
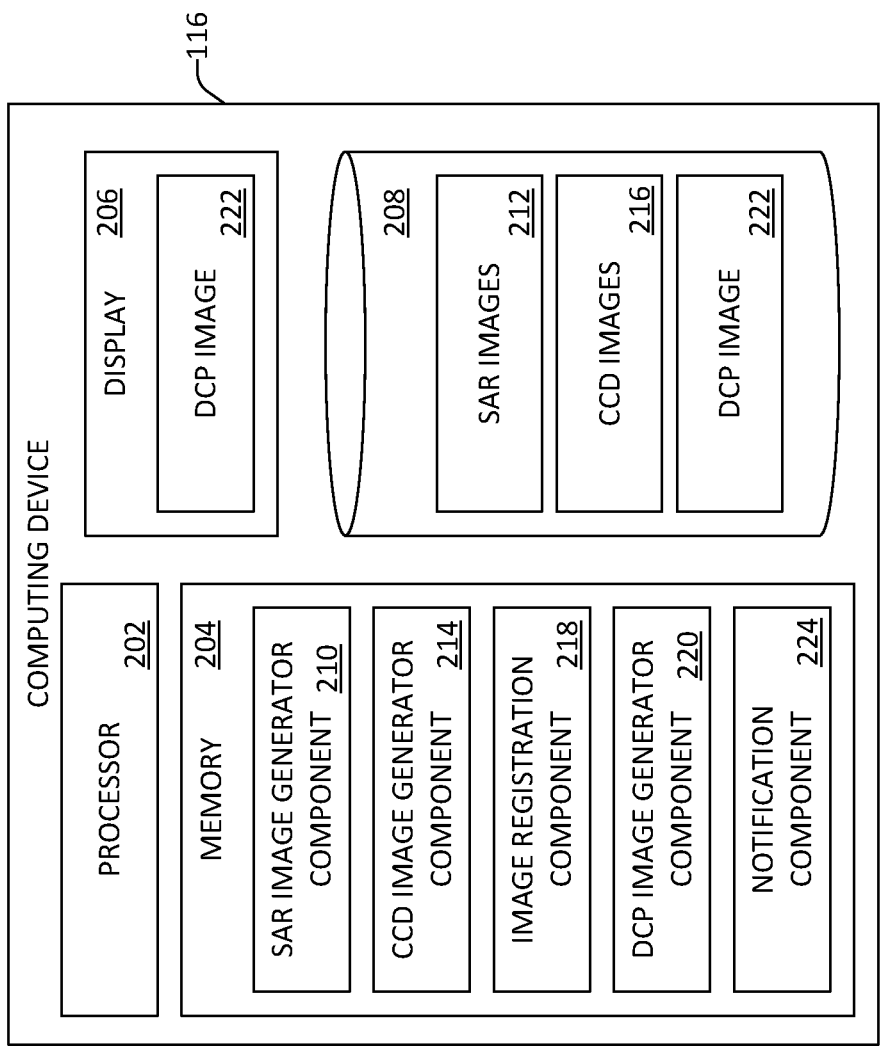
FIG. 2 is a functional block diagram of an exemplary computing device that is configured to construct a DCP image.

Now referring to FIG. 2, a functional block diagram of the computing device 116 of the SAR system 106 is illustrated. The computing device 116 includes a processor 202, memory 204 operably coupled to the processor 202, a display 206 operably coupled to the processor 202, and a data store 208 operably coupled to the processor 202. The memory 204 includes a plurality of components that are executed by the processor 202. With more specificity, the memory 204 includes a SAR image generator component 210 that is configured to generate a SAR image for each SAR pass of the aircraft 104 by the scene 102. A SAR pass by the scene 102 occurs when the aircraft 104 flies by the scene 102, the radar transmitter 108 emits radar signals towards the scene 102, and the radar receiver 112 detects radar signals 114 that have been reflected from the scene 102. Further, for each SAR pass, the SAR system 106 can have equivalent radar settings and approximately equivalent imaging geometry (i.e., the location and orientation of the aircraft 104 relative to the scene 102 is approximately equivalent for each SAR pass). Accordingly, the SAR image generator component 210 generates a plurality of SAR images 212, which can be retained in the data store 208. Each SAR image in the SAR images 212 can be assigned a timestamp that is indicative of when the SAR image was generated, and accordingly, the SAR images 212 can be arranged in sequence based upon the timestamps assigned thereto. These SAR images can be denoted as $SAR_1$ (the first SAR image in the SAR images 212), $SAR_2$ (the second SAR image in the SAR images 212), . . . $SAR_N$.

The memory 204 also includes a CCD image generator component 214 that constructs a plurality of CCD images 216 based upon the plurality of SAR images 212, wherein the CCD image generator component 214 causes the CCD images 216 to be stored in the data store 208. As noted previously, the CCD image generator component 214 generates a CCD image based upon a pair of SAR images in the SAR images 212 (e.g., a pair of consecutive SAR images in a sequence of SAR images that are ordered based upon the timestamps assigned thereto). Therefore, in an example, if the plurality of SAR images 212 includes 11 SAR images, the CCD image generator component 214 can generate 10 CCD images. The CCD images 216 can be denoted as $CCD_{1,2}$ (a CCD image generated based upon $SAR_1$ and $SAR_2$), $CCD_{2,3}$ (a CCD image generated based upon $SAR_2$ and $SAR_3$), and so forth.

Figure 3:
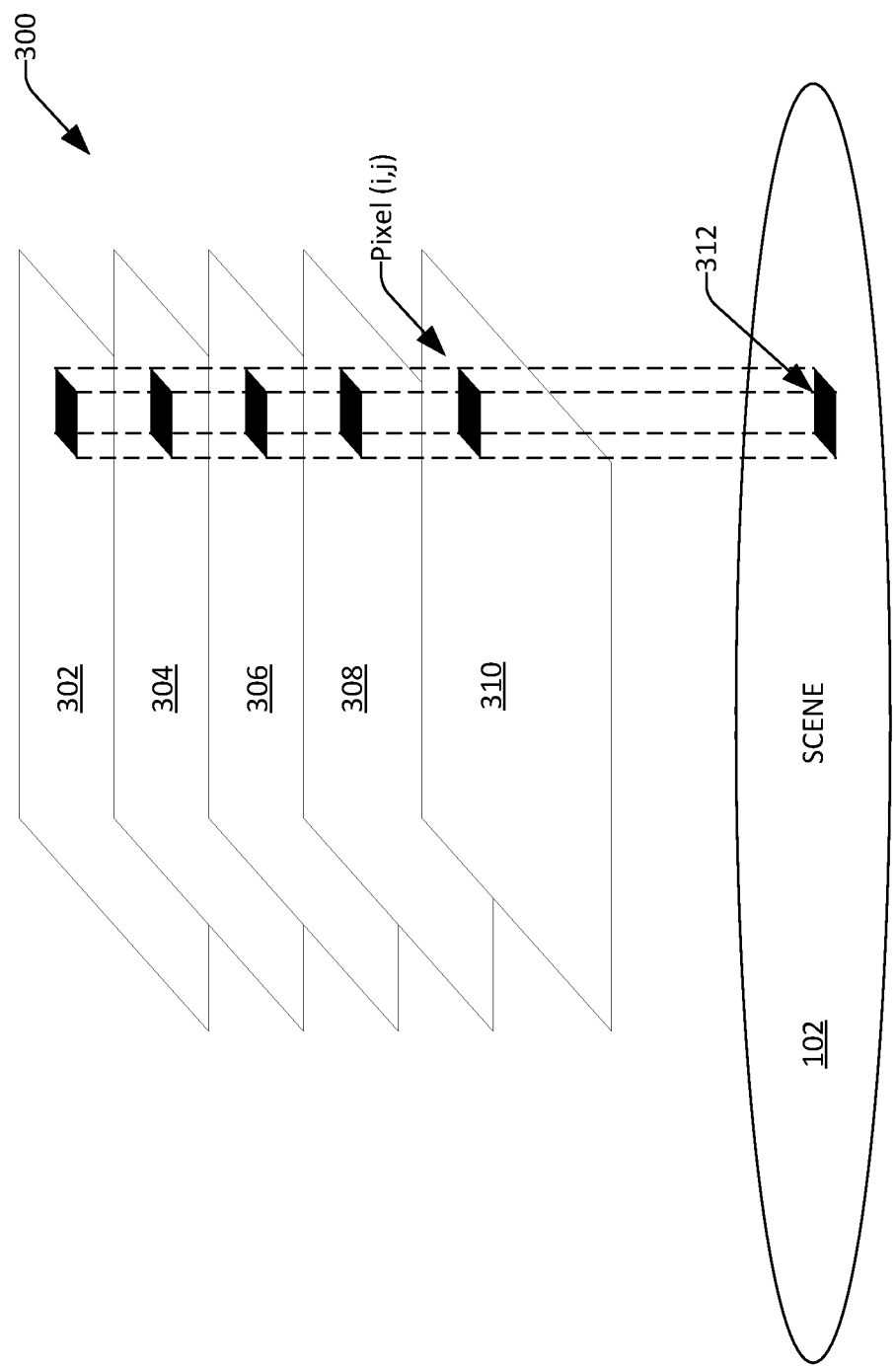
FIG. 3 depicts a registered stack of images.

The computing device 116 also includes an image registration component 218 that registers the CCD images 216 in the data store 208 with one another. Once the CCD images 216 are registered to one another, pixel (i, j) in each CCD image in the CCD images 216 is aligned with the same portion of the scene 102. Turning briefly to FIG. 3, a schematic illustrating an exemplary CCD image stack 300 is depicted. The exemplary CCD image stack 300 includes five CCD images 302-310. As can be ascertained, pixel (i, j) in each of the CCD images 302-310 aligns with the same portion 312 of the scene 102. While the image registration component 218 has been described as registering the CCD images 216 with one another after the CCD image generator component 214 has generated the plurality of CCD images 216, in another exemplary embodiment, the image registration component 218 can register the plurality of SAR images 212 to one another prior to the CCD image generator component 214 generating the CCD images 216. In such an embodiment, since the SAR images 210 are already registered with one another, the resultant CCD images 214 will likewise be registered with one another.

Returning to FIG. 2, the computing device 116 additionally includes a DCP image generator component 220 that is configured to construct a DCP image 222 based upon the plurality of CCD images 216 and cause the DCP image 222 to be stored in the data store 208 and displayed on the display 206. In summary, the DCP image generator component 220, when generating the DCP image 222, is configured to perform the following acts: 1) scale each pixel (i, j) across a pair of CCD images in the CCD images 216 according to a mapping function; 2) compute, for each pixel (i, j) across the pair of CCD images a difference between the pixel value of a first CCD image in the pair of CCD images and the pixel value of a second CCD image in the pair of CCD images, the difference being used to generate a DCP value. The DCP image generator component 220 then generates the DCP image 222 such that each pixel (i, j) in the resultant DCP image 222 is based upon its respective DCP value. Once the DCP image generator component 220 has computed a DCP value for each pixel in the DCP image 222, the DCP image generator component 220 can cause the DCP image 222 to be presented on the display 206 to an analyst. In the DCP image 222, the appearance of clutter caused by SAR shadows, vegetation, standing water, etc. is visibly reduced as compared to a CCD image of the scene 102. For example, whereas a CCD image of the scene 102 will depict a standing body of water as a region where change occurred from a first SAR pass to a second SAR pass, the DCP image 222 will not. The DCP image 222 is therefore well-suited to highlighting locations of human-activity-induced change in the scene 102.

Turning to FIG. 4, a triplet of SAR images 402, 404 and 418 of the scene 102 are illustrated. The first SAR image 402 was generated during a first SAR pass of the aircraft 104 by the scene 102, while the second SAR image 404 was generated during a second SAR pass of the aircraft 104 by the scene 102, and the third SAR image 418 was generated during a third SAR pass of the aircraft 104 by the scene 102. The first SAR image 402 comprises a first region 406 that corresponds to a forested area in the scene 102, a second region 408 that corresponds to a body of water in the scene 102, and a third region 410 that corresponds to a dirt road in the scene 102. The second SAR image 404 comprises a first region 412 that corresponds to the forested area, a second region 414 that corresponds to the body of water, and a third region 416 that corresponds to the dirt road in the scene 102. The third SAR image 418 comprises a first region 420 that corresponds to the forested area, a second region 422 that corresponds to the body of water, and a third region 424 that corresponds to the dirt road in the scene 102. It can be ascertained that while the regions 406, 412 and 420 of the SAR images 402, 404 and 418 respectively, correspond to the same forested area, the regions 406, 412 and 420 are not identical, due to leaves rustling in the forested area. Similarly, while the regions 408, 414, and 422 of the SAR images 402, 404 and 418 respectively correspond to the same body of water, the regions 408, 414 and 422 are also not identical, due to rippling of water being different between the three SAR passes for the images 402, 404 and 418.

Figure 6:
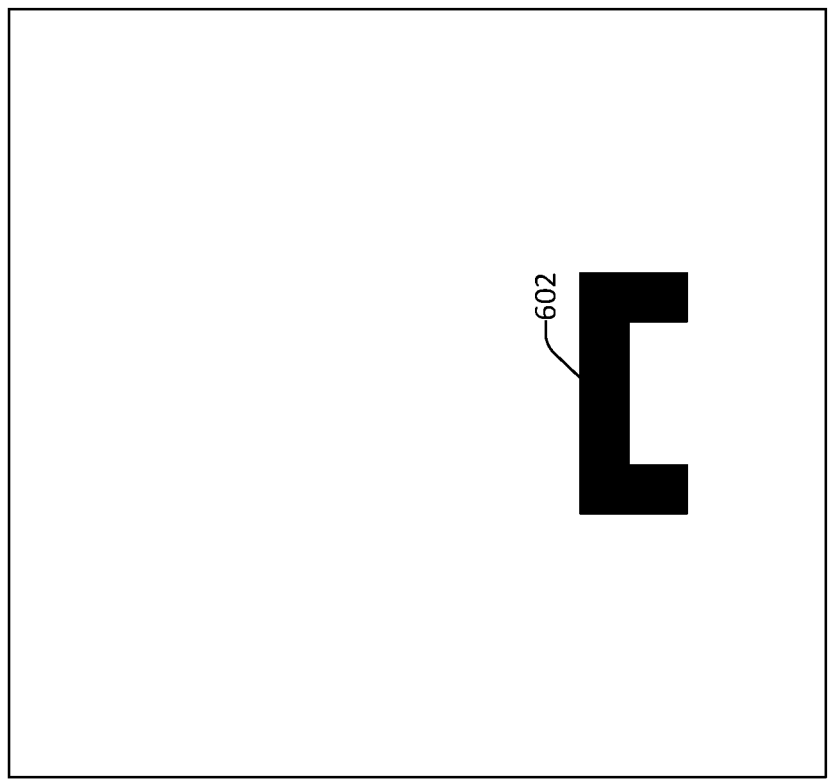
FIG. 6 illustrates an exemplary DCP image of the scene that is computed based upon the CCD images of the scene shown in FIG. 5.

Now referring to FIG. 5, an exemplary CCD image 500 that is generated by the CCD image generator component 214 based upon the SAR images 402 and 404 is illustrated. A second exemplary CCD image 501 that is generated by the CCD image generator component 214 based upon the SAR images 404 and 418 is also illustrated. The first CCD image 500 includes regions 502 and 504 that correspond to the leaved forest and the body of water represented in the SAR images 402 and 404. The CCD image 500 depicts these aspects due to coherence changes between the regions 406 and 412 and between the regions 408 and 414 in the images 402 and 404, respectively. The CCD image 500 also illustrates a region 506 where activity occurred on the dirt road between the time of the first SAR image 402 and the time of the second SAR image 404. The second CCD image 501 includes regions 508 and 510 that correspond to the leaved forest and the body of water represented in the SAR images 404 and 418, respectively. The CCD image 501 depicts these aspects due to coherence changes between the regions 412 and 420 and between the regions 414 and 422 in the images 404 and 418, respectively. The CCD image 501 also illustrates a region 512 where activity occurred on the dirt road between the time of the second SAR image 404 and the time of the third SAR image 418. Furthermore, the CCD image 501 illustrates a region 514 where activity occurred above the dirt road between the time of the second SAR image 404 and the time of the third SAR image 418. In other words, the region 514 in the CCD image 501 identifies a region in the scene 102 where at least one vehicle has left the dirt road between the SAR images 404 and 418. In the CCD image 501, however, an analyst may have difficulty identifying this change in activity, due to clutter in the CCD image 501 (e.g., the regions 508 and 510 being included in the CCD image 501, even though the rustling of leaves and the rippling of water are unlikely to be of interest to the analyst). Furthermore, the CCD image 501 is cluttered by the change 512 along the dirt road that is due to routine traffic patterns. Referring briefly to FIG. 6, an exemplary DCP image 600 is illustrated, where the DCP image 600 fails to depict regions of change where coherence is persistently low between SAR images of the scene 102 taken at different times. Therefore, the DCP image 600 does not include regions corresponding to the leaved forest and the body of water, since coherence is persistently low in these regions between pairs of SAR images (and thus these regions are persistently visible in CCD images based on various SAR images of the scene 102). Furthermore, the DCP image 600 does not include regions of routine change, such as traffic along the dirt road running through the scene 102. Hence, the analyst may review the DCP image 600 and immediately identify a region 602 corresponding to a location in the scene 102 where unexpected activity-induced change occurred.

Returning again to FIG. 2, operation of the DCP image generator component 220 is set forth in greater detail. For purposes of nomenclature, $CCD_{K,K+1}$ refers to a CCD image generated by the CCD image generator component 214 based upon SAR image $SAR_K$ and SAR image $SAR_{K+1}$ generated by the SAR image generator component 210. As noted previously, the DCP image generator component 220 generates the DCP image 222 based upon a pair of CCD images, where the pair of CCD images are generated by the CCD image generator component 214 based upon three SAR images. Stated differently, each CCD image in the pair is generated based upon a pair of SAR images, where a pair of SAR images used to generate a first CCD image can have one SAR image in common with a pair of SAR images used to generate a second CCD image, but not both.

As described above, the DCP image generator component 220 scales values of pixels of the pair of CCD images used to generate the DCP image according to a monotonic mapping function prior to computing a pixel-wise difference between the CCD images. The CCD image generator component 214 generates a CCD image by computing a sample coherence magnitude estimator for each pixel location shared between a pair of SAR images used to generate the CCD image. The sample coherence magnitude estimator for a pixel (i, j) of $CCD_{K,K+1}$ can be denoted $\hat{\gamma}_{ij}(k, k+1)$, and the value of the sample coherence magnitude estimator taken as a gray-scale pixel value to be displayed when displaying the CCD image $CCD_{K,K+1}$. The sample coherence magnitude estimator exhibits heteroskedasticity, such that the variance of the estimator increases as underlying coherence decreases. Hence, in low coherence regions of a CCD image (e.g., regions with pixel values of less than about 0.4 in a CCD image having pixel values in the domain [0,1]), pixel values may vary over a wider range than in high coherence regions of a CCD image (e.g., regions with pixel values of greater than about 0.5 in a CCD image having pixel values in the domain [0,1]). This causes a salt-and-pepper-like appearance in low coherence regions of a CCD image, which can lead to incomplete cancellation of persistent low coherence regions (e.g., vegetation and standing water) when a pixel-wise difference between two CCD images is performed. The monotonic mapping function is configured to scale pixel values of the CCD images 216 such that differences between already-low coherence values are diminished.

By way of illustration, suppose F is the mapping function and $F(\hat{\gamma}_{ij})$ is the remapped value of pixel (i, j) of a CCD image. In an illustrative example, for a first pixel location $\hat{\gamma}_{1,1}$ the values in $CCD_{1,2}$ and $CCD_{2,3}$ are $\hat{\gamma}_{1,1}(1, 2)=0.4$ and $\hat{\gamma}_{1,1}(2,3)=0.1$, respectively, and for a second pixel location $\hat{\gamma}_{1,2}$ the values in $CCD_{1,2}$ and $CCD_{2,3}$ are $\hat{\gamma}_{1,2}(1, 2)=0.9$ and $\hat{\gamma}_{1,2}(2,3)=0.6$, respectively. Thus, the absolute coherence change from $CCD_{1,2}$ to $CCD_{2,3}$ is 0.3 at both pixel locations (1,1) and (1,2). In the example, the mapping function is configured such that for the rescaled pixel values, $F(\hat{\gamma}_{1,1}(1, 2))-F(\hat{\gamma}_{1,1}(2,3)) < F(\hat{\gamma}_{1,2}(1, 2))-F(\hat{\gamma}_{1,2}(2,3))$. From the foregoing, it is to be ascertained that substantially any mapping function that is monotonically increasing across the domain of pixel values of the CCD images 216 can be used to scale the pixel values of the CCD images 216 prior to computing DCP values for each of the pixel locations of the DCP image 222. By way of example, and not limitation, the mapping function is a continuous, nonlinear function that is based on the incomplete beta function ratio. In an exemplary embodiment, the function $F(\hat{\gamma}_{ij})$ is given by the following:

$$F(\hat{\gamma}_{ij}) = 5\hat{\gamma}_{ij}^4 - 4\hat{\gamma}_{ij}^5 \qquad (1)$$

The function given in Equation 1 is an incomplete beta function ratio with parameters 4 and 2. The function of Equation 1 has a sigmoid shape when graphed and is a monotonic remapping of pixel values $\hat{\gamma}_{ij}$ that are bounded within the domain [0,1] (e.g., as is commonly the case for pixel values in grayscale CCD images) into a range of [0,1]. Referring again to the illustrative example described above, using Equation 1 the scaled pixel values are the following: $F(\hat{\gamma}_{1,1}(1, 2))=0.08704$, $F(\hat{\gamma}_{1,1}(2,3))=0.00046$, $F(\hat{\gamma}_{1,2}(1, 2))=0.91854$, and $F(\hat{\gamma}_{1,2}(2,3))=0.33696$.

Subsequent to scaling the pixel values of the pair of CCD images, the DCP image generator component 220 computes a pixel-wise difference between the pair of CCD images. The scaling of the pixel values of the pair of CCD images results in relatively smaller difference values for pixels corresponding to regions of persistent low coherence in the pair of CCD images (such as SAR shadows, vegetation, standing water, etc.) as compared with difference values for pixels that are likely to be indicative of activity-induced change (such as vehicle tracks). For example, subsequent to using Equation 1 to scale pixel values of the CCD images $CCD_{1,2}$ and $CCD_{2,3}$, the difference between the values at pixel location (1,1) is given by $F(\hat{\gamma}_{1,1}(1, 2))-F(\hat{\gamma}_{1,1}(2,3))$ =0.08658 whereas the difference between the values at pixel location (1,2) is given by $F(\hat{\gamma}_{1,2}(1, 2))-F(\hat{\gamma}_{1,2}(2,3))$ =0.58158. Thus, while a difference between pixels (1,1) and (1,2) in the unscaled CCD images $CCD_{1,2}$ and $CCD_{2,3}$ is the same, the difference computed by the DCP image generator component 220 is indicative of whether a coherence change between the images is likely to be indicative of human activity. The DCP image generator component 220 generates the DCP image 222 based upon the computed difference values.

In exemplary embodiments, the CCD image generator component 214 generates the CCD images 216 to have pixel values in the domain [0, 1]. For example, the pixel values can be gray scale values for use in connection with displaying a CCD image as a gray scale image on the display 206. In such embodiments, the DCP image generator component 220 can generate the DCP image 222 to have pixel values over the range [0,1]. In further exemplary embodiments, it may be desirable for an analyst to identify regions of new change in the scene relative to change that occurred in a prior window of time. For example, for three consecutive SAR passes over the scene 102 an analyst may desire to know what changes occurred in the scene 102 between the second SAR pass and the third SAR pass relative to those that occurred from the first SAR pass to the second SAR pass. The DCP image generator component 220 can generate the DCP image 222 such that a value of a first pixel in the DCP image 222 indicates that additional activity has occurred at a first location in the scene that is represented by the first pixel relative to activity that is depicted in a CCD image generated based upon the first SAR pass and the second SAR pass.

In an exemplary embodiment, the DCP value for each pixel location in a DCP image that is based on a pair of CCD images CCD1 and CCD2 is computed according to the following formula:

$$DCP_{1,j}(CCD1,CCD2)=F(\hat{\gamma}_{ij}(CCD2))-F(\hat{\gamma}_{ij}(CCD1))+1 \quad (2)$$

In embodiments wherein the CCD images 216 take on pixel values in the domain [0,1], $DCP_{i,j}(CCD1, CCD2)$ according to Equation 2 takes on values in the range [0,2]. The DCP image generator component 220 can employ various techniques when causing the DCP image 222 to be shown on the display 206. In an example, the DCP image generator component 220 can generate the DCP image 222 such that only regions corresponding to locations in the scene 102 where change has occurred between SAR passes used to generate CCD2 and not between SAR passes used to generate CCD1 are illustrated in the DCP image 222. In the example, if DCP values are computed according to Equation 2, only DCP values in the interval [0,1] are depicted in the DCP image 222. In an alternative example, the DCP image generator component 220 may generate the DCP image 222 such that only regions corresponding to locations in the scene 102 where change has occurred between SAR passes used to generate CCD1 and not between SAR passes used to generate CCD2 are illustrated in the DCP image 222. Thus, in the alternative example if DCP values are computed according to Equation 2, only values in the interval [1,2] are depicted in the DCP image 222. In such embodiments, the DCP image generator component 220 can apply a threshold filter to the computed DCP values to generate pixel values of the DCP image 222. Other techniques are also contemplated.

In some embodiments, the DCP image generator component 220 selects the pair of CCD images from among the plurality of CCD images 216 based upon times associated therewith. For example, each of the CCD images 216 can include metadata indicative of a time window over which the CCD image is representative of change in the scene 102, where the time window is based upon timestamps of the pair of SAR images in the SAR images 212 used to generate the CCD image. By way of example, a time window can be bounded by the times of the timestamps. Responsive to receipt of a time window of interest from an analyst at the computing device 116, the DCP image generator component 220 selects a pair of CCD images from the CCD images 216 based on the time window of interest (e.g., a pair of CCD images for which the respective time windows lie within the time window of interest). The DCP image generator component 220 subsequently generates the DCP image 222 based upon the selected pair of CCD images.

The memory 204 also includes a notification component 224 that is configured to notify the analyst, for example, when the DCP image 222 exhibits human activity-induced change. For instance, when a threshold number of pixels in the DCP image 222 have a value over a predefined activity threshold value that indicates when a pixel is likely to be indicative of human activity-induced change, the notification component 224 can transmit a notification to the analyst such that the analyst understands to closely review the resultant DCP image 222. By way of example, the predefined activity threshold value can be a user defined threshold selected based upon analyst experience. In another example, the predefined activity threshold value is based upon machine learning data generated in connection with execution of a machine learning algorithm over labeled DCP image training data.

Figure 7:
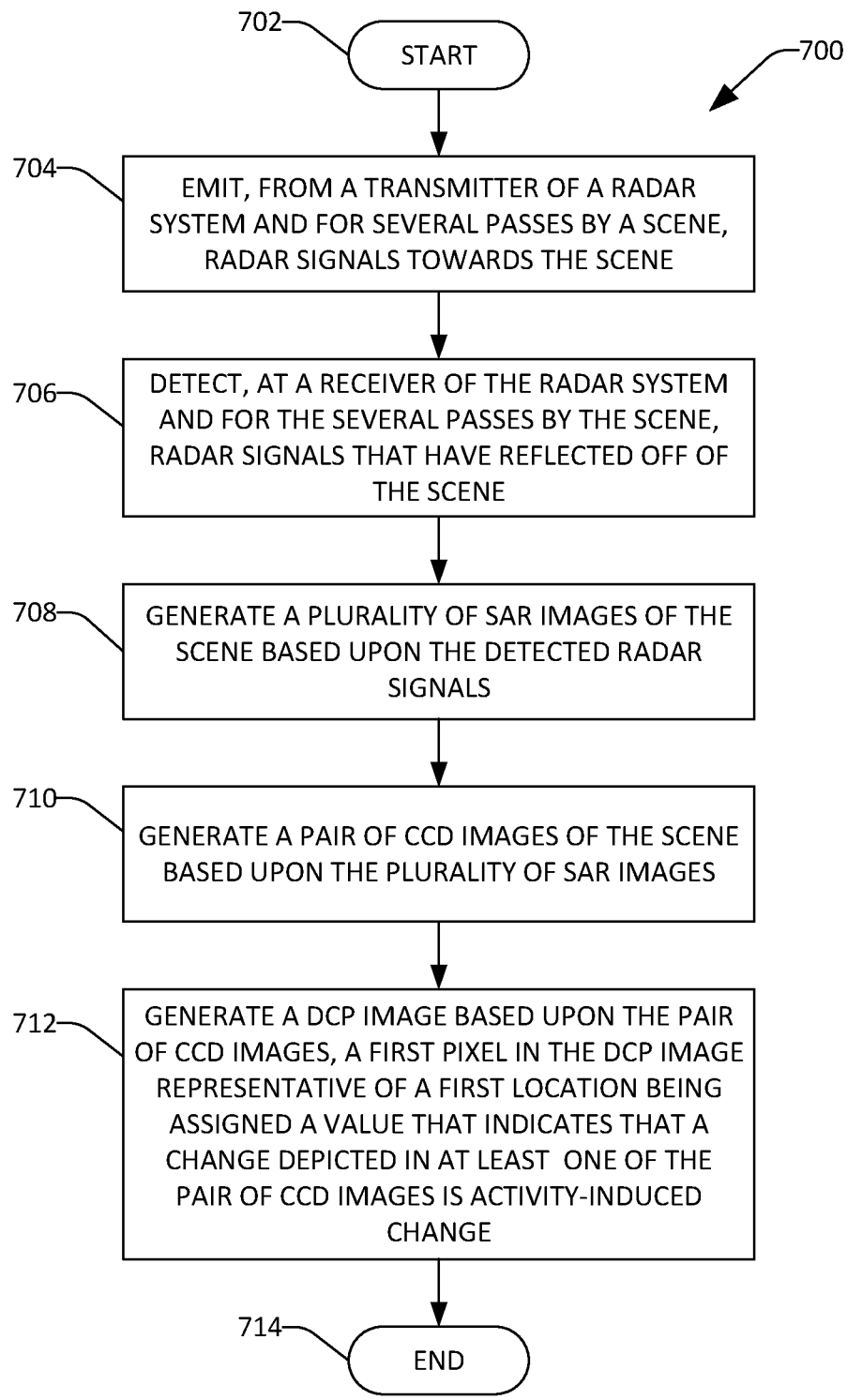
FIG. 7 is a flow diagram illustrating an exemplary methodology for generating a DCP image.
Figure 8:
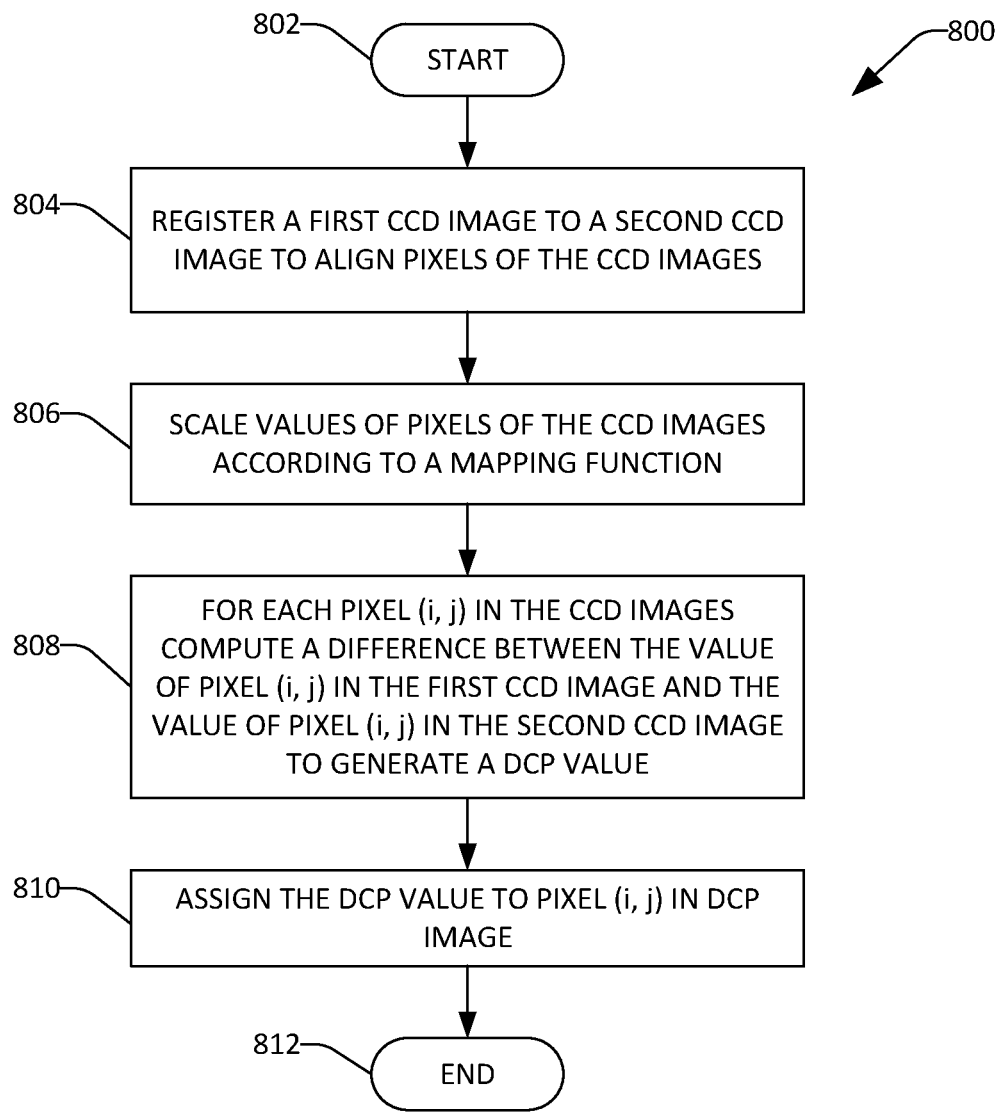
FIG. 8 is a flow diagram illustrating an exemplary methodology for generating a DCP image based upon a pixel-wise difference of coherence values for pixels of a registered pair of CCD images.

FIGS. 7-8 illustrate exemplary methodologies relating to constructing and displaying an DCP image. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

Moreover, the acts described herein may be computer-executable instructions that can be implemented by one or more processors and/or stored on a computer-readable medium or media. The computer-executable instructions can include a routine, a sub-routine, programs, a thread of execution, and/or the like. Still further, results of acts of the methodologies can be stored in a computer-readable medium, displayed on a display device, and/or the like.

Referring now to FIG. 7, an exemplary methodology 700 for constructing a DCP image is illustrated. The methodology 700 starts at 702, and at 704, radar signals are emitted from a transmitter of a radar system, for several passes by a scene, towards the scene. As noted previously, the transmitter of the radar system is included in an aircraft that passes by the scene from time to time.

At 706, a receiver of the radar system, for the several passes by the scene, detects radar signals that are reflected off the scene. At 708, a plurality of SAR images of the scene are generated based upon the detected radar signals; one SAR image for each pass over the scene.

At 710, a pair of CCD images of the scene are generated based upon the plurality of SAR images. As noted above, $CCD_{K,K+1}$ can be generated based upon $SAR_K$ and $SAR_{K+1}$.

At 712, an image for analysis (a DCP image) is generated based upon the pair of CCD images, wherein a first pixel in the DCP image that represents a first location in the scene is assigned a value that indicates that change that is depicted in at least one of the pair of CCD images at the first location in the scene is activity-induced change (e.g., as opposed to resulting from SAR shadows, standing water, vegetation, etc.). The methodology 700 completes at 714.

Now turning to FIG. 8, an exemplary methodology 800 for assigning values to pixels of a DCP image is illustrated. The methodology 800 starts at 802, and at 804, a first CCD image is registered to a second CCD image to align pixels of the CCD images, wherein, for example, pixel (i, j) of each of the CCD images is aligned with the same portion of a scene captured in SAR images upon which the CCD images are based. At 806, the pixels of the CCD images are scaled according to a mapping function (e.g., a monotonically increasing mapping function as described above). As previously described, the mapping function is configured to reduce pixel values of already-low coherence in the CCD images relative to pixels of higher coherence. At 808, for each pixel (i, j) in the CCD images, a difference between the value of pixel (i, j) in the first CCD image and the value of pixel (i, j) in the second CCD image is computed, and a DCP value generated based upon the computed difference. At 810, the DCP value is assigned to pixel (i, j) in the DCP image, such that each pixel in the DCP image is assigned a DCP value. The methodology 800 completes at 812.

Figure 9:
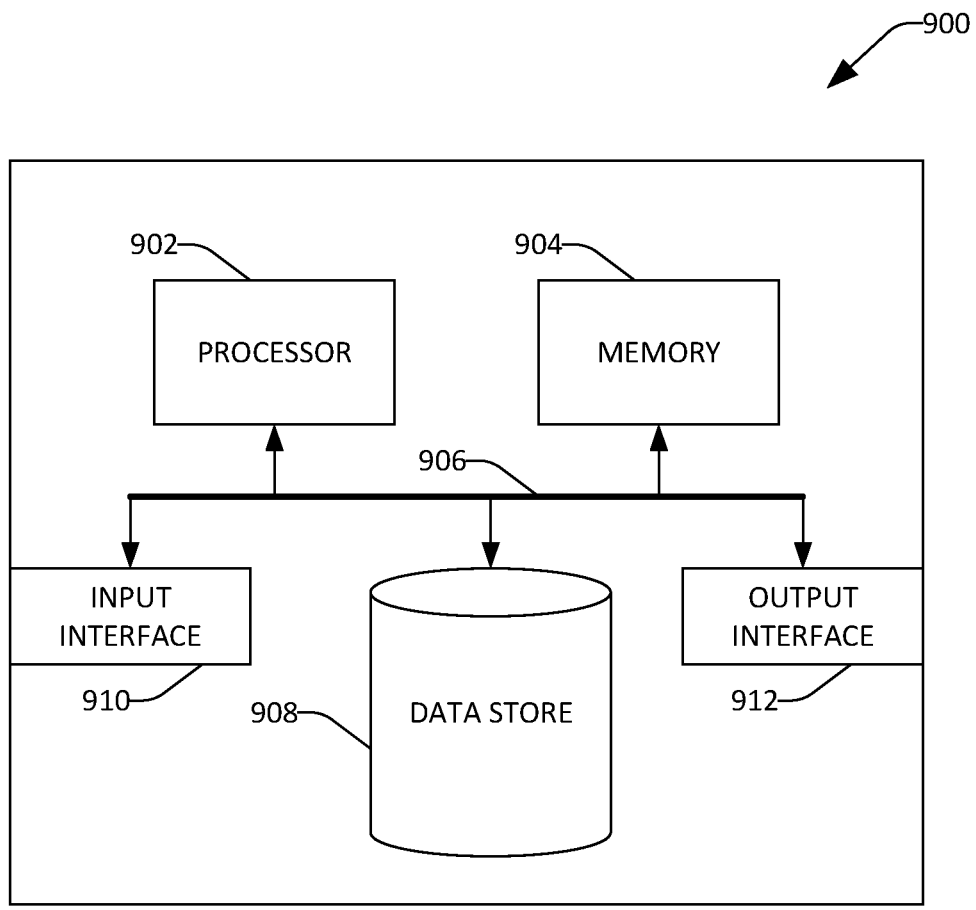
FIG. 9 is an exemplary computing system.

Referring now to FIG. 9, a high-level illustration of an exemplary computing device 900 that can be used in accordance with the systems and methodologies disclosed herein is illustrated. For instance, the computing device 900 may be used in a system that is configured to generate DCP images. By way of another example, the computing device 900 can be used in a system that is configured to generate SAR images and/or CCD images. The computing device 900 includes at least one processor 902 that executes instructions that are stored in a memory 904. The instructions may be, for instance, instructions for implementing functionality described as being carried out by one or more components discussed above or instructions for implementing one or more of the methods described above. The processor 902 may access the memory 904 by way of a system bus 906. In addition to storing executable instructions, the memory 904 may also store images, SAR return data, etc.

The computing device 900 additionally includes a data store 908 that is accessible by the processor 902 by way of the system bus 906. The data store 908 may include executable instructions, images, SAR data, etc. The computing device 900 also includes an input interface 910 that allows external devices to communicate with the computing device 900. For instance, the input interface 910 may be used to receive instructions from an external computer device, from a user, etc. The computing device 900 also includes an output interface 912 that interfaces the computing device 900 with one or more external devices. For example, the computing device 900 may display text, images, etc. by way of the output interface 912.

It is contemplated that the external devices that communicate with the computing device 900 via the input interface 910 and the output interface 912 can be included in an environment that provides substantially any type of user interface with which a user can interact. Examples of user interface types include graphical user interfaces, natural user interfaces, and so forth. For instance, a graphical user interface may accept input from a user employing input device(s) such as a keyboard, mouse, remote control, or the like and provide output on an output device such as a display. Further, a natural user interface may enable a user to interact with the computing device 900 in a manner free from constraints imposed by input device such as keyboards, mice, remote controls, and the like. Rather, a natural user interface can rely on speech recognition, touch and stylus recognition, gesture recognition both on screen and adjacent to the screen, air gestures, head and eye tracking, voice and speech, vision, touch, gestures, machine intelligence, and so forth.

Additionally, while illustrated as a single system, it is to be understood that the computing device 900 may be a distributed system. Thus, for instance, several devices may be in communication by way of a network connection and may collectively perform tasks described as being performed by the computing device 900.

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and Blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

Alternatively, or in addition, the functionally described herein can be performed, at least in part, by one or more hardware logic components. For example, and without limitation, illustrative types of hardware logic components that can be used include Field-programmable Gate Arrays (FPGAs), Program-specific Integrated Circuits (ASIC s), Program-specific Standard Products (ASSPs), System-on-a-chip systems (SOCs), Complex Programmable Logic Devices (CPLDs), Graphics Processor Units (GPUs), etc.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system comprising:
    a radar system, the radar system comprises a transmitter that is configured to emit radar signals and a receiver that is configured to detect radar signals;
    at least one processor; and
    memory that stores instructions that, when executed by the at least one processor, cause the at least one processor to perform acts comprising:
        generating three synthetic aperature radar (SAR) images of a scene, the SAR images constructed based upon radar signals detected by the receiver of the radar system responsive to the radar signals being emitted by the transmitter towards the scene and reflecting off of the scene;
        generating a first coherent change detection (CCD) image of the scene and a second CCD image of the scene based upon the three SAR images, wherein each CCD image is constructed based upon a respective pair of SAR images in the three SAR images, the CCD images comprising pixels that represent locations in the scene, and wherein pixel values of each of the CCD images are indicative of changes in the scene between the respective pair of SAR images used to construct the CCD image;
        generating a differenced change product (DCP) image of the scene based upon the CCD images, the DCP image comprises pixels that represent locations in the scene, wherein each pixel in the DCP image is assigned a respective value based upon values assigned to pixels in the CCD images that represent the same location in the scene as the pixel, and further wherein a first pixel in the pixels of the DCP image that represents a first location in the scene is assigned a first value that indicates that change that has occurred at the first location in the scene is activity-induced change; and
        causing the DCP image to be displayed on a display of an analyst.

2. The system of claim 1, the acts further comprising scaling pixel values in the CCD images according to a mapping function, wherein generating the DCP image is based upon the CCD images with the scaled pixel values.

3. The system of claim 2 wherein the mapping function comprises a monotonic continuous function.

4. The system of claim 3, wherein the monotonic continuous function is a nonlinear function.

5. The system of claim 3, wherein the monotonic continuous function is based on the incomplete beta function.

6. The system of claim 3, wherein the monotonic continuous function is a sigmoid function.

7. The system of claim 3, wherein the monotonic continuous function maps pixel values of the CCD images from a domain of zero to one into a range of zero to one.

8. The system of claim 1, wherein the first CCD image comprises a second pixel that represents the first location and the second CCD image comprises a third pixel that represents the first location, and wherein generating the DCP image comprises assigning the first value to the first pixel in the DCP image based upon a difference between a value of the second pixel and a value of the third pixel.

9. The system of claim 1, the acts further comprising:
    prior to generating the DCP image, registering the first CCD image and the second CCD image to one another.

10. The system of claim 1, the acts further comprising:
    prior to generating the CCD images, registering the three SAR images to one another.

11. The system of claim 1, wherein the first CCD image is representative of changes in the scene over a first window of time, the second CCD image is representative of changes in the scene over a second window of time, the second window of time subsequent to the first window of time, wherein the DCP image depicts only changes that occurred in the scene over the second window of time.

12. The system of claim 1, wherein the first CCD image is representative of changes in the scene over a first window of time, the second CCD image is representative of changes in the scene over a second window of time, the second window of time subsequent to the first window of time, wherein the DCP image depicts only changes that occurred in the scene over the first window of time.

13. The system of claim 1, the acts further comprising:
    prior to generating the DCP image, selecting the first CCD image and the second CCD image from a larger collection of CCD images, wherein the first CCD image and the second CCD image are selected from the larger collection of CCD images based upon time windows assigned to CCD images in the larger collection of CCD images.

14. A method that facilitates indicating to an analyst that an anomalous alteration has been identified at a location in a scene, the method comprising:
    emitting, from a radar system transmitter, radar signals towards the scene as an aircraft that includes the radar system transmitter passes by the scene;
    detecting, with a radar system receiver, the radar signals that have reflected off of the scene;
    repeating the acts of emitting and detecting for a plurality of passes by the scene;
    generating a plurality of synthetic aperture radar (SAR) images of the scene for the plurality of passes by the scene;
    generating two coherent change detection (CCD) images of the scene based upon the plurality of SAR images of the scene, wherein each CCD image is generated based upon a respective pair of SAR images in the plurality of SAR images, wherein further each CCD image is indicative of alterations in the scene between the pair of SAR images on which the CCD image is based;
    generating a differenced change product (DCP) image based upon the two CCD images, the DCP image comprises pixels that represent locations in the scene, wherein each pixel in the DCP image is assigned a respective value based upon values assigned to pixels in the two CCD images that represent the same location in the scene as the pixel, and further wherein a first pixel in the DCP image that represents a first location in the scene is assigned a first value that indicates that an alteration that is depicted in one of the CCD images is an activity-induced alteration; and causing the DCP image to be displayed on a display of an analyst.

15. The method of claim 14, further comprising scaling pixel values in the CCD images according to a mapping function, wherein generating the DCP image is based upon the CCD images with the scaled pixel values.

16. The method of claim 15, wherein the mapping function is a monotonically increasing continuous function.

17. The method of claim 16, wherein the mapping function is a sigmoid function.

18. The method of claim 14, wherein the first CCD image comprises a second pixel that represents the first location and the second CCD image comprises a third pixel that represents the first location, and wherein generating the DCP image comprises assigning the first value to the first pixel in the DCP image based upon a difference between a value of the second pixel and a value of the third pixel.

19. The method of claim 14, further comprising registering the SAR images to one another prior to generating the two CCD images of the scene.

20. A computer-readable storage medium comprising instructions that, when executed by a processor, cause the processor to perform acts comprising:

receiving a first coherent change detection (CCD) image of a scene and a second CCD image, each of the CCD images is based upon a respective pair of synthetic aperture radar (SAR) images of the scene, each of the CCD images is indicative of changes in the scene between two SAR passes of the scene;

remapping pixel values of the CCD images based upon a monotonic mapping function;

computing a pixel-wise difference between the CCD images subsequent to remapping the pixel values of the CCD images; and generating a differenced change product (DCP) image responsive to computing the pixel-wise difference between the CCD images, wherein a pixel in the DCP image is representative of a first location in the scene, the pixel in the DCP image is assigned a value that is based upon a difference between a value of a second pixel in the first CCD image that is representative of the first location and a value of a third pixel in the second CCD image that is representative of the first location, the value of the pixel in the DCP image indicating that a change at the first location represented in at least one of the first CCD image or the second CCD image is an activity-induced change.

* * * * *